(12) United States Patent
Foong et al.

(10) Patent No.: US 8,586,413 B2
(45) Date of Patent: Nov. 19, 2013

(54) MULTI-CHIP MODULE HAVING A SUPPORT STRUCTURE AND METHOD OF MANUFACTURE

(75) Inventors: Yin Lye Foong, Milpitas, CA (US); Cheng Sim Kee, Bayan Lepas Penang (MY); Lay Hong Lee, Penang (MY); Mohamed Suhaizal Bin Abu-Hassan, Kedah (MY)

(73) Assignee: Spansion LLC, Sunnyvale, CA (US)

( * ) Notice: Subject to any disclaimer, the term of this patent is extended or adjusted under 35 U.S.C. 154(b) by 1081 days.

(21) Appl. No.: 11/125,396

(22) Filed: May 4, 2005

(65) Prior Publication Data
US 2006/0249826 A1 Nov. 9, 2006

(51) Int. Cl.
*H01L 21/00* (2006.01)
(52) U.S. Cl.
USPC ........... 438/109; 438/107; 438/110; 257/686; 257/723
(58) Field of Classification Search
USPC .................. 257/685, 686, 687, 723, 725, 777; 438/109, 107, 110
See application file for complete search history.

(56) References Cited

U.S. PATENT DOCUMENTS

| | | | |
|---|---|---|---|
| 5,291,061 A | 3/1994 | Ball | |
| 5,323,060 A | 6/1994 | Fogal et al. | |
| 6,337,225 B1 | 1/2002 | Foong et al. | |
| 6,710,455 B2 * | 3/2004 | Goller et al. | 257/777 |
| 6,781,222 B2 * | 8/2004 | Wu et al. | 257/684 |
| 6,943,294 B2 * | 9/2005 | Kang et al. | 174/541 |
| 2002/0096755 A1 | 7/2002 | Fukui | |
| 2002/0151103 A1 | 10/2002 | Nakamura | |
| 2004/0201088 A1 * | 10/2004 | Kim et al. | 257/686 |
| 2004/0241907 A1 | 12/2004 | Higashino | |

FOREIGN PATENT DOCUMENTS

| | | |
|---|---|---|
| JP | 08-088316 | 4/1996 |
| JP | 2003-218316 | 7/2003 |
| JP | 2003-303937 | 10/2003 |

OTHER PUBLICATIONS

English translation of Japanese Official Action for Application No. 2011-116875, dated Apr. 23, 2013, 3 pages.
Japanese Official Action for Application No. 2011-116875, dated Apr. 23, 2013, 2 pages.
English-language abstract for: Shukuka, JP 2003-218316.
English-language abstract for: Futoshi, JP 08-088316.
English-language abstract for: Yoichiro et al., JP 2003-303937.

* cited by examiner

*Primary Examiner* — Ajay K Arora
(74) *Attorney, Agent, or Firm* — Sterne, Kessler, Goldstein & Fox P.L.L.C.

(57) ABSTRACT

A multi-chip module and a method for manufacturing the multi-chip module that mitigates wire breakage. A first semiconductor chip is mounted and wirebonded to a support substrate. A spacer is coupled to the first semiconductor chip. A support material is disposed on the spacer and a second semiconductor chip is positioned on the support material. The second semiconductor chip is pressed into the support material squeezing it into a region adjacent the spacer and between the first and second semiconductor chips. Alternatively, the support material is disposed on the first semiconductor chip and a die attach material is disposed on the spacer. The second semiconductor chip is pressed into the die attach material and the support material, squeezing a portion of the support material over the spacer edges. Wirebonds are formed between the support substrate and the first and second semiconductor chips.

19 Claims, 6 Drawing Sheets

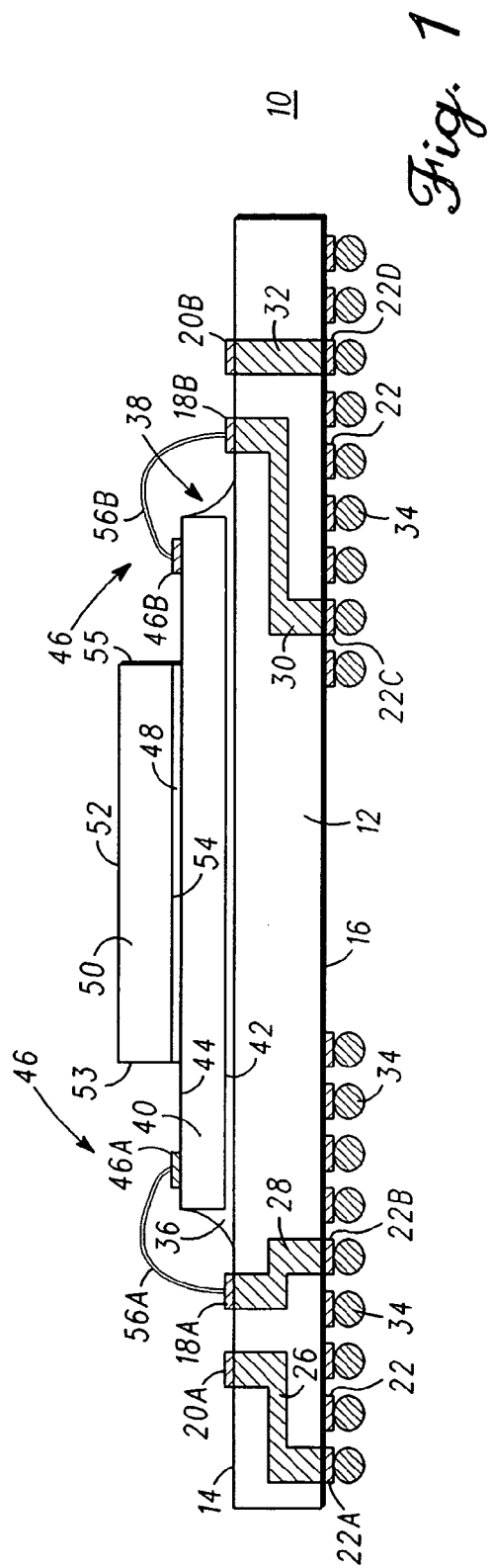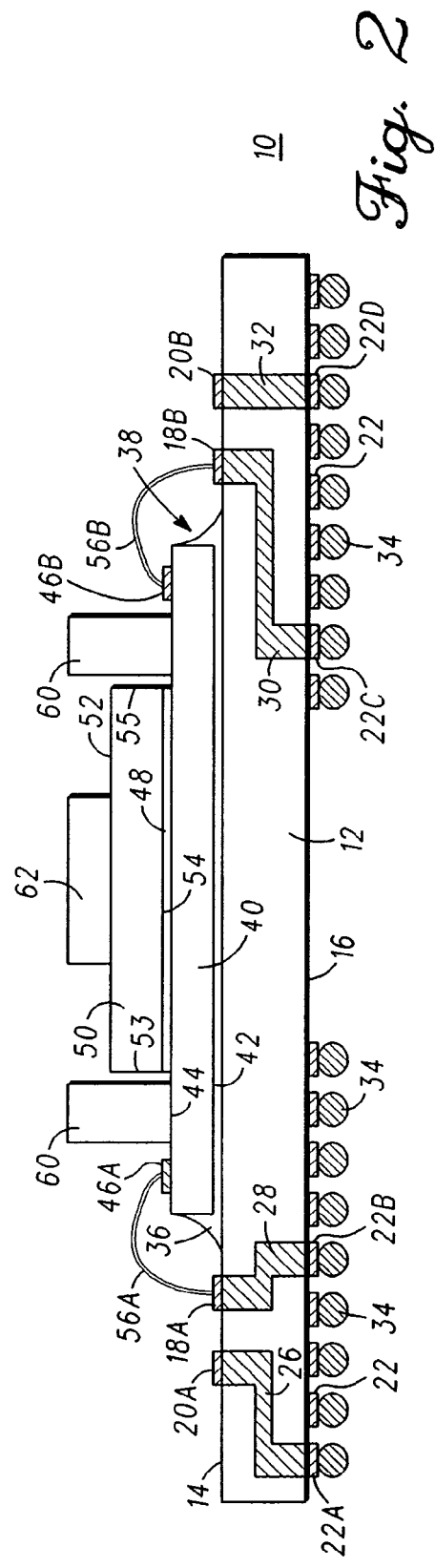

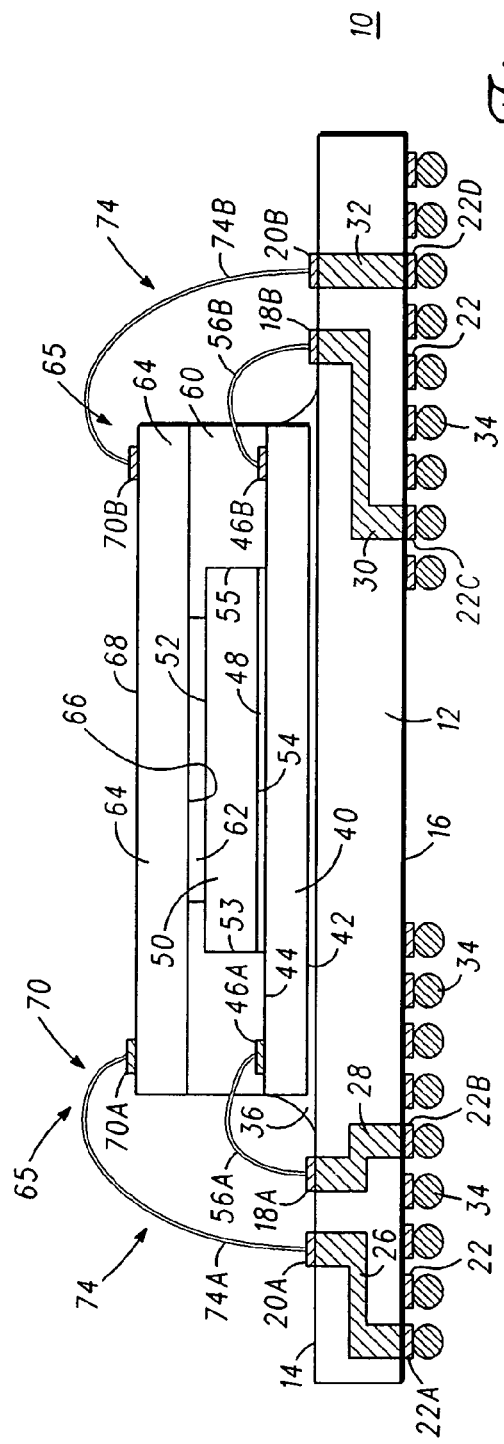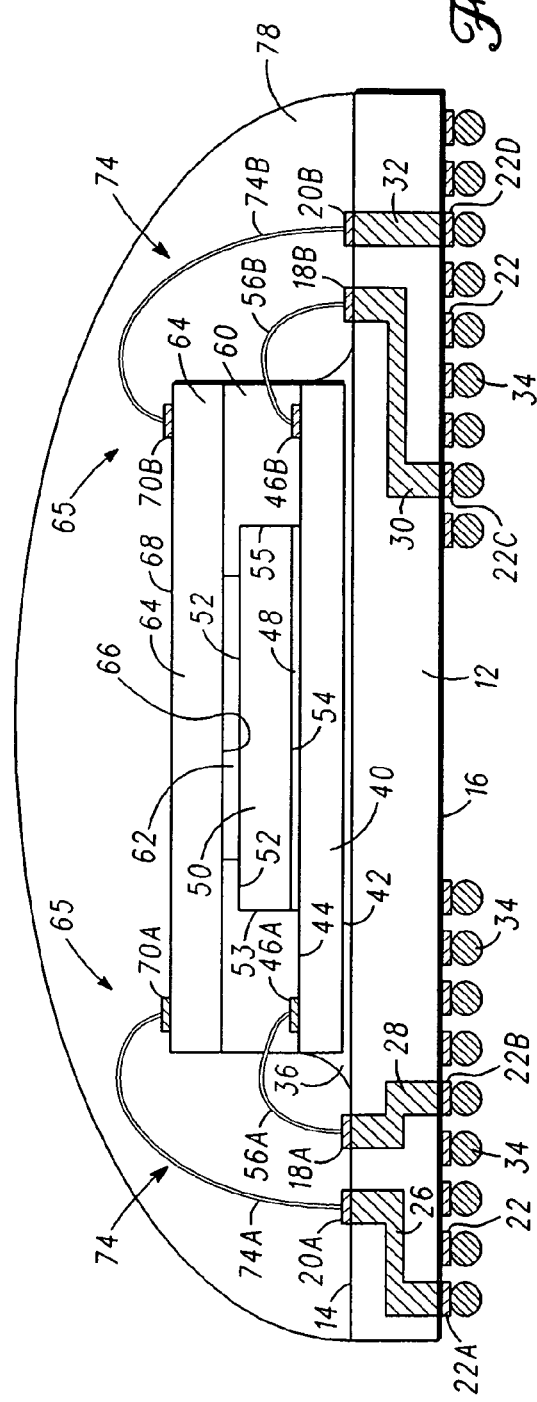

MULTI-CHIP MODULE HAVING A SUPPORT STRUCTURE AND METHOD OF MANUFACTURE

FIELD OF THE INVENTION

The present invention relates, in general, to semiconductor components and, more particularly, to semiconductor components comprising multi-chip modules.

BACKGROUND OF THE INVENTION

The desire for faster, cheaper, and more efficient semiconductor components has motivated semiconductor component manufacturers to shrink the sizes of the devices fabricated in a semiconductor chip and place multiple semiconductor chips in a single package typically referred to as a multi-chip module. The semiconductor chips in a multi-chip module can be placed either in a horizontal orientation, i.e., beside each other, or in a vertical orientation, i.e., vertically stacked on top of each other. In a conventional vertically stacked multi-chip module, a first semiconductor chip is attached to a circuit board by adhesive bonding followed by wirebonding bonding pads located on the semiconductor chip to corresponding bonding pads located on the circuit board. A spacer is formed on or attached to the first semiconductor chip and a second semiconductor chip is attached to the spacer. Then bonding pads located on the second semiconductor chip are coupled to corresponding bonding pads located on the circuit board using, for example, a wirebonding process. The spacer must be smaller than the first semiconductor chip to accommodate the wirebonding process. What's more, the spacer is typically smaller than the second semiconductor chip. A drawback with this type of structure is that the portions of the second semiconductor chip that overhang the spacer are pliable or springy. Thus, when the bonding pads located on the overhanging portion of the second semiconductor chip are wirebonded to the corresponding bonding pads located on the circuit board, the pliability of the overhanging portions of the second semiconductor chip weakens the bonds formed to bonding pads on the second semiconductor chip. This bond weakening causes catastrophic device failure.

Accordingly, it would be advantageous to have a multi-chip module and a method for manufacturing the multi-chip module that does not degrade the integrity of the bonds formed to the bonding pads. It would be of further advantage for the method and structure to be cost efficient and suitable for integration with a variety of multi-chip module processes.

SUMMARY OF THE INVENTION

The present invention satisfies the foregoing need by providing a multi-chip module and a method for manufacturing the multi-chip module. In accordance with one embodiment, the present invention includes providing a support substrate having first and second major surfaces, wherein the support substrate has a chip receiving area and a plurality of bonding pads. A first semiconductor chip is coupled to the chip receiving area, wherein the first semiconductor chip has a plurality of bonding pads. A first bonding pad of the first semiconductor chip is coupled to a first bonding pad of the support substrate. A spacer is coupled to a portion of the first semiconductor chip. A support material is disposed on at least one of the spacer or the first semiconductor chip. A second semiconductor chip is positioned on the support material, wherein the second semiconductor chip has a first major surface and a plurality of bonding pads. A first bonding pad of the second semiconductor chip is coupled to a second bonding pad of the support substrate.

In accordance with another embodiment, the present invention comprises a method for manufacturing a multi-chip module that includes providing a support substrate having a first semiconductor chip mounted to a chip or die receiving area on the support substrate. The support substrate has a plurality of bonding pads and the first semiconductor chip has a plurality of bonding pads. A spacer is coupled to the first semiconductor chip and a support material is disposed on one of the spacer or the first semiconductor chip. A semiconductor chip is coupled to the spacer such that the support material becomes positioned between the first semiconductor chip and the second semiconductor chip thereby providing support for the second semiconductor chip.

In accordance with yet another embodiment, the present invention comprises a multi-chip module having a support substrate that has a chip receiving area and a plurality of bonding pads. A first semiconductor chip having a plurality of bonding pads is mounted to the chip receiving area. A spacer having first and second opposing edges is coupled to the first semiconductor chip. A support material is in contact with the spacer. A second semiconductor chip is coupled to the spacer, wherein a portion of the support material is positioned between the first semiconductor chip and the second semiconductor chip.

BRIEF DESCRIPTION OF THE DRAWINGS

The present invention will be better understood from a reading of the following detailed description, taken in conjunction with the accompanying drawing figures, in which like reference numbers designate like elements and in which:

FIG. 1 is a cross-sectional side view of a multi-chip module at a beginning stage of manufacture in accordance with an embodiment of the present invention;

FIG. 2 is a cross-sectional side view of the multi-chip module of FIG. 1 at a later stage of manufacture and taken along section line 2-2 of FIG. 3;

FIG. 4 is a cross-sectional side view of the multi-chip module of FIGS. 2 and 3 at a later stage of manufacture;

FIG. 5 is a cross-sectional side view of the multi-chip module of FIG. 4 at a later stage of manufacture;

DETAILED DESCRIPTION

Figure 3:
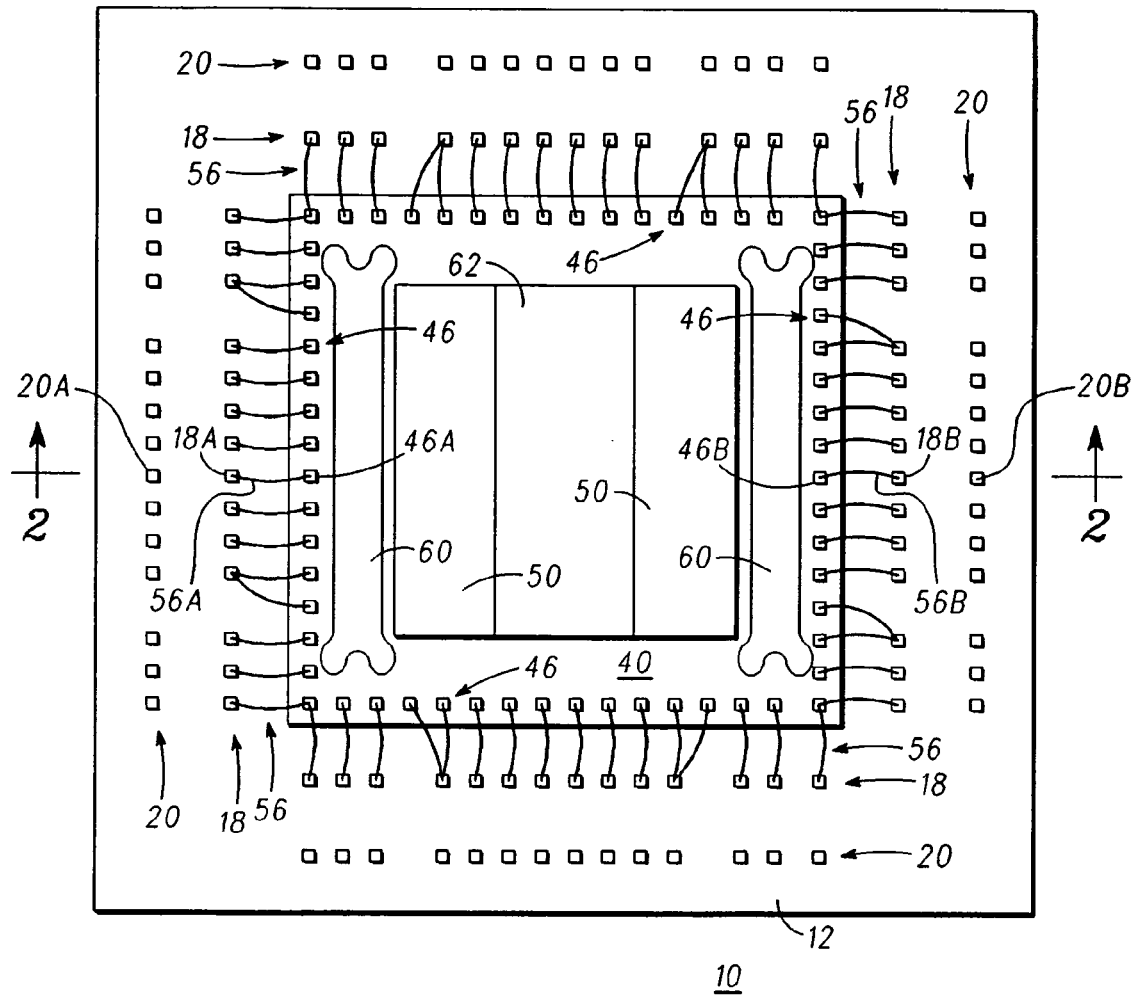
FIG. 3 is a top view of the multi-chip module of FIG. 2.

Generally, the present invention provides a multi-chip module and a method for manufacturing the multi-chip module, wherein the semiconductor chips of the multi-chip module are vertically stacked. In vertically stacking the semiconductor chips of a multi-chip module, a spacer is inserted between the semiconductor chips to allow clearance for the wirebonds. A portion of the semiconductor chip positioned above the spacer overhangs the edges of the spacer. The portions of a semiconductor chip overhanging the spacer are pliable. Although the pliability increases the fragility of semiconductor chips in general, the increased fragility is more pronounced in semiconductor chips having thicknesses of less than about 0.6 millimeters (mm). This pliability allows the semiconductor chip to vibrate during the wirebonding process, which breaks the wires being bonded to bonding pads on the semiconductor chip. In accordance with the present invention, the vibration is mitigated by forming a support material under the portion of the second semiconductor chip that overhangs the spacer. The support material provides additional rigidity to the semiconductor chip, which decreases the vibrations of the overhanging portions of the semiconductor chip and improves the reliability of the wirebond.

FIG. 1 is cross-sectional side view of a portion of a multi-chip module 10 at an intermediate stage of manufacture in accordance with an embodiment of the present invention. What is shown in FIG. 1 is a Ball Grid Array (BGA) support structure 12 having top and bottom surfaces 14 and 16, respectively. BGA support substrate 12 is formed from a resin such as an epoxy resin, a polyimide resin, a triazine resin, or a phenolic resin. Preferably, the resin material of BGA support substrate 12 is bismaleimidetriazine (BT) resin. Other suitable materials for support substrate 12 include epoxy-glass composites, FR-4, ceramics, and the like. It should be understood that substrate 12 is not limited to being a BGA substrate but may also be a Pin Grid Array (PGA) substrate, a ceramic substrate, a printed circuit board, or the like. Bonding pads 18A and 18B and bonding pads 20A and 20B are formed on top surface 14. A plurality of bonding pads 22 are formed on bottom surface 16. Bonding pads 18A, 18B, 20A, and 20B are electrically connected to bonding pads 22B, 22C, 22A, and 22D, respectively, on bottom surface 16 through electrical interconnects 28, 30, 26, and 32 that extend through BGA support substrate 12. For the sake of clarity, only four interconnects are shown as extending through BGA support substrate 12 in FIG. 1. However, it should be understood that all or nearly all of the bonding pads on the top surface of a support substrate such as support substrate 12 are coupled to bonding pads on the bottom surface of the support substrate. It should be further understood that bonding pads 18A and 18B are two of a plurality of bonding pads 18 that are formed on top surface 14. Similarly, bonding pads 20A and 20B are two of a plurality of bonding pads 20 that are formed on top surface 14. (The pluralities of bonding pads 18 and 20 are further illustrated and discussed with reference to in FIG. 3). Solder balls 34 are attached to bonding pads 22.

Still referring to FIG. 1, a die attach material 36 is dispensed on a semiconductor chip receiving area 38 and a semiconductor chip or die 40 is placed on die attach material 36. Semiconductor chip 40 has a bottom surface 42 and a top surface 44. A plurality of bonding pads 46 is disposed around the periphery of top surface 44. Bottom surface 42 of a semiconductor chip or die 40 is placed on die attach material 36. Although only bonding pads 46A and 46B are shown, it should be understood that bonding pads 46A and 46B are part of plurality of bonding pads 46, which plurality is further shown and described with reference to FIG. 3. The combination of substrate 12, semiconductor chip 40, and die attach material 36 is placed in a curing oven and die attach material 36 is cured. By way of example, die attach material 36 is cured by heating to a temperature ranging from about 100 degrees Celsius (° C.) to about 175° C. for a time ranging from about 5 minutes to about 60 minutes. Suitable die attach materials include silver filled epoxy, silica filled epoxy blend, an epoxy film filled with an organic material, and the like.

After curing die attach material 36, a die attach material 48 is disposed on a central portion of top surface 44 and a spacer 50 is placed on die attach material 48. Spacer 50 has top and bottom surfaces 52 and 54, respectively, and edges 53 and 55. Spacer 50 may be a dielectric material, a semiconductor material such as, for example, silicon, another semiconductor chip, or the like. Although spacer 50 is shown as having a square shape, its shape is not a limitation of the present invention. For example, spacer 50 may have a rectangular shape, a round shape, a triangular shape, etc. Die attach material 48 is cured by heating it to a temperature ranging from about 100° C. to about 175° C. for a time ranging from about 5 minutes to about 60 minutes. Suitable die attach materials include silver filled epoxy, silica filled epoxy blend, an epoxy film filled with an organic material, and the like.

Still referring to FIG. 1, bonding pads 46 on semiconductor chip 40 are electrically connected to corresponding bonding pads 18 on BGA substrate 12 using, for example, a wirebonding process. What is shown in FIG. 1 is bonding pad 46A coupled to bonding pad 18A by an interconnect wire 56A and bonding pad 46B coupled to bonding pad 18B by an interconnect wire 56B. Although only two interconnect wires are shown in FIG. 1, it should be understood that typically plurality of interconnects 56 comprises more than two interconnect wires. (The plurality of interconnect wires 56 is further illustrated and discussed with reference to in FIG. 3).

Referring now to FIG. 2, a cross-sectional side view of multi-chip module 10 further along in manufacture is illustrated. What is shown in FIG. 2 is a support material 60 disposed on surface 44 of semiconductor chip 40 and a die attach material 62 disposed on surface 52 of spacer 50. Preferably, support material 60 is an epoxy paste that is a thermal conductor and an electrical insulator. Examples of the epoxy paste comprising support material 60 include an epoxy material filled with polytetrafluoroethylene sold under the trademark Teflon (Teflon is a trademark of E.I. Du Pont De Demours and Company Corp.), a nonconductive paste (e.g., silica) filled with an inorganic material, bismaleimide material filled with polytetrafluoroethylene sold under the trademark Teflon, and the like. Suitable materials for die attach material 62 include silver filled epoxy, silica filled epoxy blend, an epoxy film filled with an organic material, and the like.

Referring now to FIG. 3, a top view of multi-chip module 10 is shown, wherein the top view illustrates the same stage of manufacture as that shown in FIG. 2. In other words, FIG. 2 is a cross-sectional side view taken along section line 2-2 of FIG. 3. FIG. 3 further illustrates the plurality of bonding pads 18, the plurality of bonding pads 20, the plurality of bonding pads 46, the plurality of wire interconnects 56, as well as the individual bonding pads 18A, 18B, 20A, and 20B and the individual interconnects 56A and 56B shown in FIG. 2. In addition, FIG. 3 illustrates support material 60 and die attach material 62. Although support material 60 is shown as having a double-Y or dogbone shape, this is not a limitation of the present invention. For example, support material 60 can be formed to have circular shapes, triangular shapes, quadrilateral shapes, pentagonal shapes, as well as other polygonal shapes.

Referring now to FIG. 4, a cross-sectional side view of multi-chip module 10 further along in manufacture is illustrated. A semiconductor chip 64 is placed on die attach material 62. More particularly, semiconductor chip 64 has a backside 66 that is placed on die attach material 62 and a front side 68 that has a plurality of bonding pads 70 formed thereon. Pressure is applied to semiconductor chip 64 to position it in die attach material 62 and to squeeze support material 60 in a lateral direction so that it substantially fills the region between surfaces 44 and 66. In this region, peripheral portions 65 of semiconductor chip 64 overhang spacer 50. Support material 60 and die attach material 62 are cured by being heated to a temperature ranging from about 100° C. to about 175° C. for a time ranging from about 5 minutes to about 60 minutes. Because support material 60 substantially fills the region between surfaces 44 and 66, the peripheral portions 65 of semiconductor chip 64 do not freely overhang edges 53 and 54, but are supported by support material 60. Thus, peripheral portions 65 do not bounce significantly during a subsequent wirebonding step. An advantage of placing support material 60 between surfaces 44 and 66 is that it improves the manufacturability and reliability of wirebonds formed in multi-chip modules.

A plurality of bonding pads 70 are electrically connected to corresponding bonding pads of plurality of bonding pads 20 using, for example, a wirebonding process. More particularly, bonding pad 70A is electrically connected to bonding pad 20A by an interconnect wire 74A and bonding pad 70B is electrically connected to bonding pad 20B by an interconnect wire 74B. Interconnect wires 74A and 74B are two interconnect wires of plurality of interconnect wires 74.

Referring now to FIG. 5, a protective covering 78 is formed over semiconductor chip 64, interconnect wires 56 and 74, and BGA substrate 12. The protective covering illustrated in FIG. 5 is a glob top material. However, it should be understood that the type of protective material is not limited to being a glob top material. For example, protective covering 78 may be a lid or cap.

Figure 6:
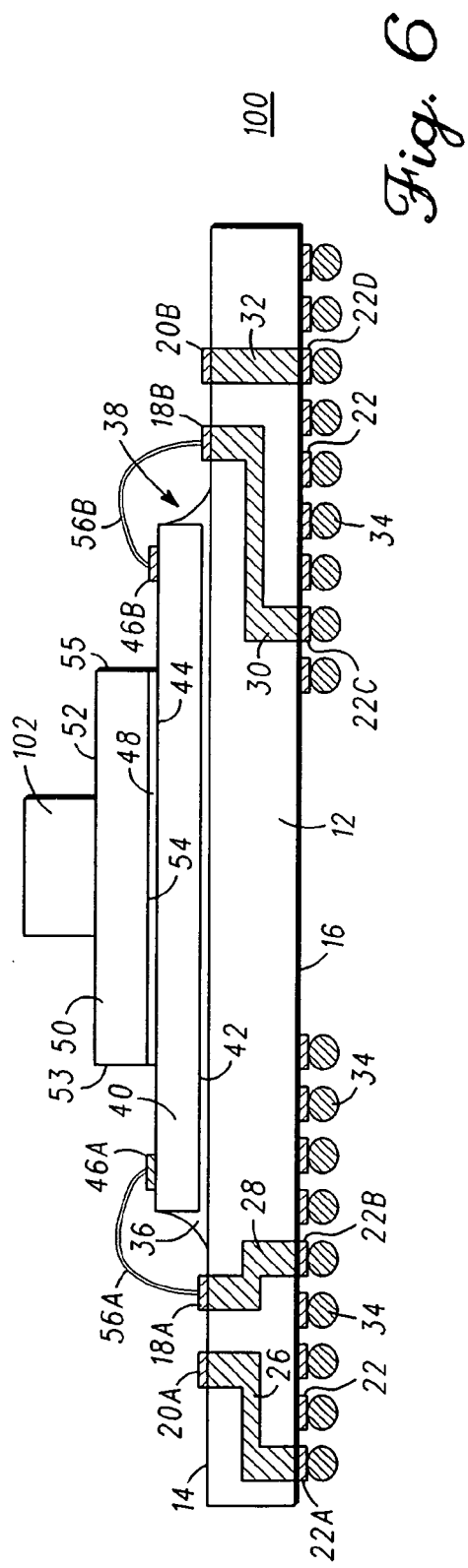
FIG. 6 is a cross-sectional side view of a multi-chip module at a beginning stage of manufacture in accordance with another embodiment of the present invention and taken along section line 6-6 of FIG. 7.

FIG. 6 illustrates a multi-chip module 100 in accordance with another embodiment of the present invention. The beginning steps in the manufacture of multi-chip module 100 are the same as those for the manufacture of multi-chip module 10. Thus, the description of FIG. 6 continues from that of FIG. 1. A support material 102 is disposed on a central portion of spacer surface 52. Preferably, support material 102 is an epoxy paste that is thermally conductive and electrical non-conductive, i.e. it is an electrical insulator. Suitable epoxy pastes for support material 102 include epoxy material filled with polytetrafluoroethylene sold under the trademark Teflon, nonconductive paste (e.g., silica) filled with an inorganic material, bismaleimide material filled with polytetrafluoroethylene sold under the trademark Teflon, and the like. Support material 102 also serves as a die attach material.

Figure 7:
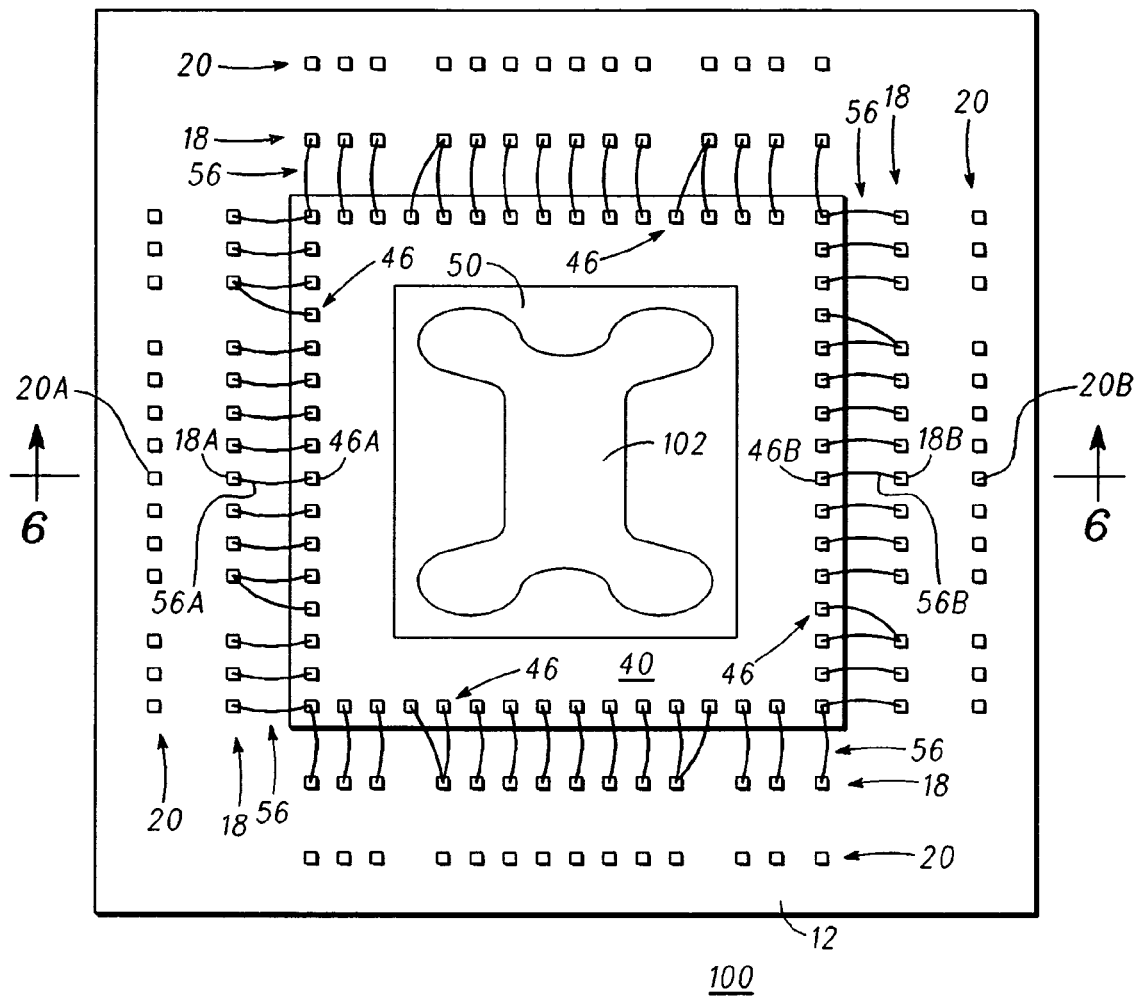
FIG. 7 is a top view of the multi-chip module of FIG. 6.

Referring now to FIG. 7, a top view of multi-chip module 100 is shown wherein the top view illustrates the same stage of manufacture as that shown in FIG. 6. In other words, FIG. 6 is a cross-sectional side view taken along section line 6-6 of FIG. 7. Like FIG. 3, FIG. 7 further illustrates the plurality of bonding pads 18, the plurality of bonding pads 20, the plurality of bonding pads 46, the plurality of wire interconnects 56, as well as the individual bonding pads 18A, 18B, 20A, and 20B and the individual interconnects 56A and 56B shown in FIGS. 2 and 6. In addition, FIG. 7 illustrates support material 102. Although support material 102 is shown as having a double-Y or dogbone shape, this is not a limitation of the present invention. For example, support material 102 can be formed to have circular shapes, triangular shapes, quadrilateral shapes, pentagonal shapes, and other polygonal shapes.

Figure 8:
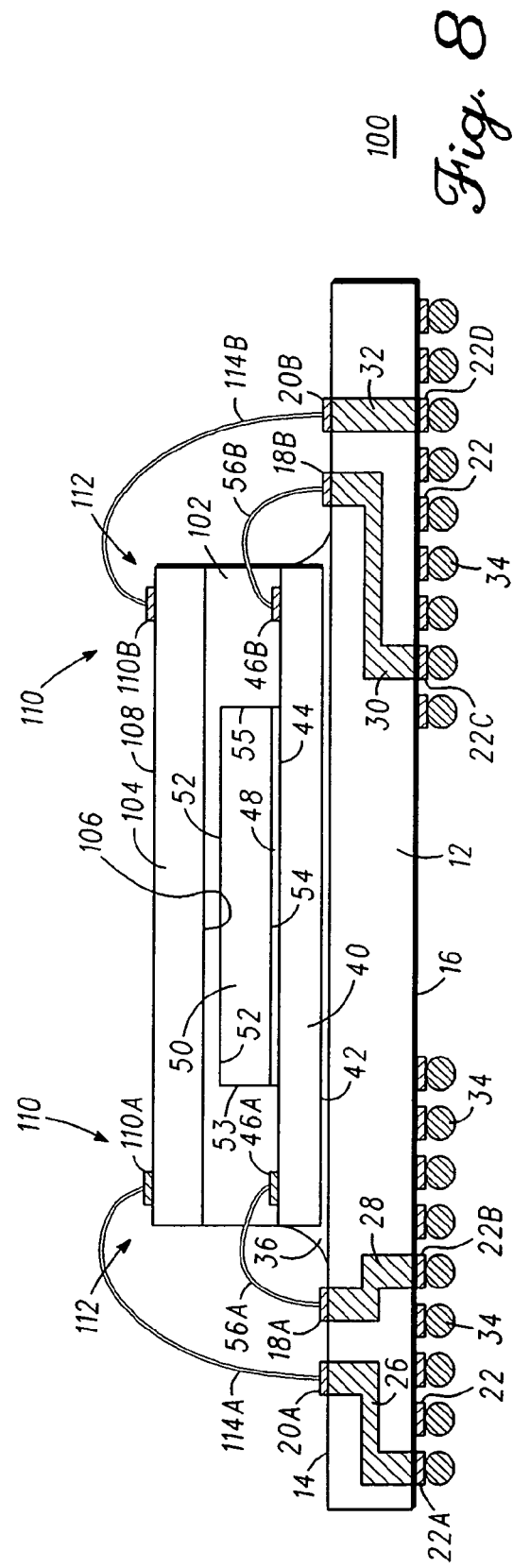
FIG. 8 is a cross-sectional side view of the multi-chip module of FIGS. 6 and 7 at a later stage of manufacture.

Referring now to FIG. 8, a cross-sectional side view of multi-chip module 100 further along in manufacture is illustrated. A semiconductor chip 104 is placed on support material 102. More particularly, semiconductor chip 104 has a backside 106 that is placed on support material 102 and a front side 108 that has a plurality of bonding pads 110 formed thereon. Pressure is applied to semiconductor chip 104 to position it in support material 102 and to urge support material 102 over edges 53 and 55 of spacer 50 and into the region between surfaces 44 and 106. A portion of support material 102 remains on spacer 50 and a portion of support material 102 substantially fills the region between surfaces 44 and 106. Because support material 102 substantially fills the region between surfaces 44 and 106, the peripheral portions 112 of semiconductor chip 104 do not overhang freely, but are supported. Thus, peripheral portions 112 do not significantly bounce during a subsequent wirebonding step. Support material 102 is cured by being heated to a temperature ranging from about 100° C. to about 175° C. for a time ranging from about 5 minutes to about 60 minutes. An advantage of placing support material 102 between surfaces 44 and 106 is that it improves the manufacturability and reliability of wirebonds formed in multi-level semiconductor packaging structures.

A plurality of bonding pads 110 are electrically connected to corresponding bonding pads of plurality of bonding pads 20 using, for example, a wirebonding process. More particularly, bonding pad 110A is electrically connected to bonding pad 20A by an interconnect wire 114A and bonding pad 110B is electrically connected to bonding pad 20B by an interconnect wire 114B. For clarity of description, only two interconnect wires, i.e., interconnect wires 114A and 114B, of a plurality of interconnect wires are shown in FIG. 8.

Figure 9:
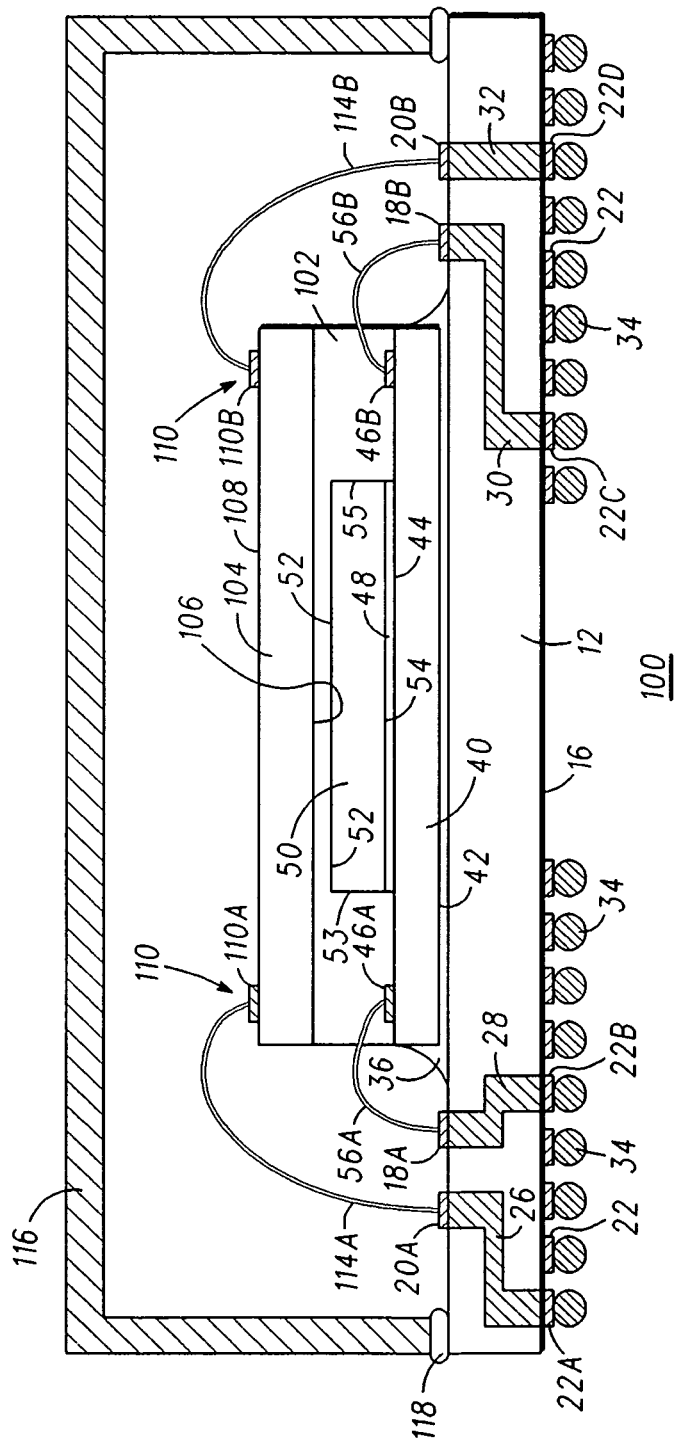
FIG. 9 is a cross-sectional side view of the multi-chip module of FIG. 8 at a later stage of manufacture.

Referring now to FIG. 9, a protective covering 116 is formed over semiconductor chip 104, interconnect wires 56A, 56B, 114A, and 114B, and BGA support substrate 12. Protective covering 116 illustrated in FIG. 9 is a lid secured to BGA support substrate 12 by a lid attach material 118. It should be understood that the type of protective covering is not limited to being a lid. For example, protective covering 114 may be a glob top material or other suitable protective material.

By now it should be appreciated that a multi-chip module having vertically stacked semiconductor chips and a method for manufacturing the multi-chip module been provided. An advantage of multi-chip modules in accordance with the present invention is that it provides a means for decreasing vibration or bounce of regions of a semiconductor chip during a wirebonding process. This improves the reliability of the wirebonds and decreases catastrophic device failure. Another advantage of the present invention is that it increases the variety in the sizes of the semiconductor chips that can be bonded to a spacer. Because the support material provides additional support for the semiconductor chip, larger chips can be mounted to the spacer. In addition, the method is readily integrable into multi-chip module processing flows in a cost and time efficient manner.

Although certain preferred embodiments and methods have been disclosed herein, it will be apparent from the foregoing disclosure to those skilled in the art that variations and modifications of such embodiments and methods may be made without departing from the spirit and scope of the invention. For example, the support material may be disposed on the spacer and the first semiconductor chip. Alternatively, an adhesive film can be used to couple semiconductor chip 64 to spacer 50 rather than using a die attach material such as die attach material 48. An advantage of using an adhesive material is that an adhesive material does not have to be cured. It is intended that the invention shall be limited only to the extent required by the appended claims and the rules and principles of applicable law.

What is claimed is:

1. A method for manufacturing a multi-chip module, comprising the steps of:

providing a support substrate having first and second major surfaces, wherein the support substrate has a chip receiving area and a plurality of bonding pads;

coupling a first semiconductor chip to the chip receiving area, the first semiconductor chip having a plurality of bonding pads;

coupling a first bonding pad of the plurality of bonding pads of the first semiconductor chip to a first bonding pad of the plurality of bonding pads of the support substrate;

coupling a spacer to a central portion of the first semiconductor chip;

disposing an uncured support material on at least one of the spacer or the first semiconductor chip outside the central portion;

positioning a second semiconductor chip on the uncured support material, the second semiconductor chip having a first major surface and a plurality of bonding pads, wherein positioning the second semiconductor chip squeezes the uncured support material in a lateral direction, thereby causing the uncured support material to substantially fill a region between the first and second semiconductor chips including a space between the second semiconductor chip and a top surface of the spacer so as to provide support for a peripheral portion of the second semiconductor chip overhanging the spacer; and coupling a first bonding pad of the plurality of bonding pads of the second semiconductor chip to a second bonding pad of the plurality of bonding pads of the support substrate.

2. The method of claim 1, wherein the step of coupling the first bonding pad of the plurality of bonding pads of the second semiconductor chip to the second bonding pad of the plurality of bonding pads of the support substrate includes wirebonding the first bonding pad of the plurality of bonding pads of the second semiconductor chip to the second bonding pad of the plurality of bonding pads of the support substrate.

3. The method of claim 2, wherein the step of coupling the first bonding pad of the plurality of bonding pads of the first semiconductor chip to the first bonding pad of the plurality of bonding pads of the support substrate includes wirebonding the first bonding pad of the plurality of bonding pads of the first semiconductor chip to the first bonding pad of the plurality of bonding pads of the support substrate.

4. The method of claim 1, wherein the step of coupling the first bonding pad of the plurality of bonding pads of the first semiconductor chip to the first bonding pad of the plurality of bonding pads of the support substrate includes wirebonding the first bonding pad of the plurality of bonding pads of the first semiconductor chip to the first bonding pad of the plurality of bonding pads of the support substrate.

5. The method of claim 1, wherein the steps of positioning the second semiconductor chip on the uncured support material includes urging the uncured support material over first and second edges of the spacer.

6. The method of claim 1, wherein the step of disposing the uncured support material includes disposing the uncured support material on the spacer.

7. The method of claim 1, wherein the step of disposing the uncured support material includes disposing the uncured support material on the first semiconductor chip.

8. The method of claim 1, wherein the spacer comprises a semiconductor material.

9. The method of claim 1, wherein the spacer comprises a third semiconductor chip having first and second major surfaces and at least one bonding pad.

10. The method of claim 1, further including the step of dispensing a die attach material on the spacer before positioning the second semiconductor chip on the uncured support material.

11. The method of claim 1, wherein the step of coupling the second semiconductor chip to the spacer includes disposing an adhesive film between the spacer and the second semiconductor chip.

12. A method for manufacturing a multi-chip module, comprising the steps of:

providing a support substrate having a first semiconductor chip mounted to a chip receiving area of the support substrate, the support substrate having a plurality of bonding pads and the first semiconductor chip having a plurality of bonding pads;

coupling a spacer to a central portion of the first semiconductor chip, the spacer having first and second opposing edges;

disposing an uncured support material on one of the spacer or the first semiconductor chip outside the central portion; and coupling a second semiconductor chip to the spacer such that the uncured support material is urged laterally so as to substantially fill a region between the first semiconductor chip and the second semiconductor chip including a space between the second semiconductor chip and a top surface of the spacer thereby providing support for a peripheral portion of the second semiconductor chip overhanging the spacer.

13. The method of claim 12, wherein the step of disposing the uncured support material on one of the spacer or the first semiconductor chip includes disposing the uncured support material on the spacer.

14. The method of claim 12, further including the step of disposing a die attach material in a central portion of the spacer.

15. The method of claim 12, wherein the uncured support material comprises an epoxy.

16. The method of claim 12, wherein the step of disposing the uncured support material on one of the spacer or the first semiconductor chip includes disposing the uncured support material on the first semiconductor chip.

17. The method of claim 16, wherein the step of coupling a second semiconductor chip to the spacer includes urging the uncured support material laterally so that the uncured support material becomes positioned between the first semiconductor chip and the second semiconductor chip.

18. The method of claim 12, wherein the step of coupling the second semiconductor chip to the spacer includes coupling the second semiconductor chip to the spacer using an adhesive film.

19. A method for manufacturing a multi-chip module, comprising the steps of:

mounting a first semiconductor chip on a support substrate;

coupling a spacer to a central portion of the first semiconductor chip;

disposing an uncured support material over the first semiconductor chip outside the central portion;

positioning a second semiconductor chip over the uncured support material and the first semiconductor chip;

applying pressure to the second semiconductor chip to squeeze the uncured support material such that the uncured support material substantially fills a gap between the first and second semiconductor chips including a space between the second semiconductor chip and a top surface of the spacer, thereby providing support for a peripheral portion of the second semiconductor chip overhanging the spacer.

* * * * *

UNITED STATES PATENT AND TRADEMARK OFFICE
CERTIFICATE OF CORRECTION

PATENT NO. : 8,586,413 B2  
APPLICATION NO. : 11/125396  
DATED : November 19, 2013  
INVENTOR(S) : Foong et al.

Page 1 of 1

It is certified that error appears in the above-identified patent and that said Letters Patent is hereby corrected as shown below:

In the Specification:

Column 3, line 62, "(° C.) to about 175° C." should read --(° C) to about 175° C--.

Column 4, line 10, "100°C. to about 175°C." should read --100°C to about 175°C--.

Signed and Sealed this
Thirteenth Day of May, 2014

Michelle K. Lee
*Deputy Director of the United States Patent and Trademark Office*